United States Patent
Weybright et al.

(10) Patent No.: US 10,096,521 B2
(45) Date of Patent: Oct. 9, 2018

(54) SRAM DESIGN TO FACILITATE SINGLE FIN CUT IN DOUBLE SIDEWALL IMAGE TRANSFER PROCESS

(71) Applicant: INTERNATIONAL BUSINESS MACHINES CORPORATION, Armonk, NY (US)

(72) Inventors: Mary E. Weybright, Pleasant Valley, NY (US); Robert C. Wong, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/396,993

(22) Filed: Jan. 3, 2017

(65) Prior Publication Data
US 2017/0178963 A1     Jun. 22, 2017

Related U.S. Application Data

(63) Continuation of application No. 14/971,212, filed on Dec. 16, 2015, now Pat. No. 9,564,446.

(51) Int. Cl.
*H01L 21/82* (2006.01)
*H01L 21/8234* (2006.01)
(Continued)

(52) U.S. Cl.
CPC .. *H01L 21/823431* (2013.01); *H01L 21/0273* (2013.01); *H01L 21/3065* (2013.01);
(Continued)

(58) Field of Classification Search
CPC ............. H01L 21/0337; H01L 21/0332; H01L 21/3086; H01L 21/823431; H01L 21/823481; H01L 27/0886
See application file for complete search history.

(56) References Cited

U.S. PATENT DOCUMENTS

| | | | |
|---|---|---|---|
| 6,190,979 B1 * | 2/2001 | Radens | H01L 21/28035 257/E21.149 |
| 2006/0292772 A1 * | 12/2006 | Anderson | H01L 21/823412 438/197 |

(Continued)

OTHER PUBLICATIONS

List of IBM Patents or Patent Applications Treated as Related; (Appendix P), Date Filed Jan. 5, 2017; 2 pages.
(Continued)

*Primary Examiner* — Nathan W Ha
(74) *Attorney, Agent, or Firm* — Cantor Colburn LLP; Jennifer Anda

(57) ABSTRACT

A double sidewall image transfer process for forming FinFET structures having a fin pitch of less than 40 nm generates paired fins with a spacing determined by the width of a sidewall spacer that forms a second mandrel. Here, the fin pairs are created at two different spacings without requiring the minimum space for the standard sidewall structure. An enlarged space between paired fins is created by placing two first mandrel shapes close enough so as to overlap or merge two sidewall spacer shapes so as to form a wider second mandrel upon further processing. The fin pair created from the wider second mandrel is spaced at about 2 times the fin pair created from the narrower second mandrel. For some circuits, such as an SRAM bitcell, the wider second mandrel can be utilized to form an inactive fin not utilized in the circuit structure, which can be removed. In some embodiments, all dummy inactive fins are eliminated for a simpler process.

6 Claims, 9 Drawing Sheets

(51) Int. Cl.
*H01L 21/3065* (2006.01)
*H01L 27/11* (2006.01)
*H01L 21/027* (2006.01)
*H01L 21/308* (2006.01)

(52) U.S. Cl.
CPC .. *H01L 21/3086* (2013.01); *H01L 21/823481* (2013.01); *H01L 27/1104* (2013.01)

(56) References Cited

U.S. PATENT DOCUMENTS

| | | | |
|---|---|---|---|
| 2015/0170973 A1* | 6/2015 | Kim | H01L 21/82382 438/702 |
| 2015/0279684 A1* | 10/2015 | Wei | H01L 21/823431 438/424 |
| 2015/0311075 A1* | 10/2015 | Huang | H01L 21/0337 438/702 |
| 2017/0054003 A1* | 2/2017 | Liao | H01L 29/66795 |

OTHER PUBLICATIONS

Mary E. Weybright., et al., Pending U.S. Appl. No. 14/971,212, entitled "SRAM Design to Facilitate Single Fin Cut in Double Sidewall Image Transfer Process," filed Dec. 16, 2015.

\* cited by examiner

SRAM DESIGN TO FACILITATE SINGLE FIN CUT IN DOUBLE SIDEWALL IMAGE TRANSFER PROCESS

DOMESTIC PRIORITY

This application is a Continuation of U.S. Non-Provisional application Ser. No. 14/971,212, entitled "SRAM DESIGN TO FACILITATE SINGLE FIN CUT IN DOUBLE SIDEWALL IMAGE TRANSFER PROCESS", filed Dec. 16, 2015, which is incorporated herein by reference in its entirety.

BACKGROUND

The present invention relates to the manufacture of semiconductor devices with fins, and more particularly, to an SRAM design to facilitate single fin cut in a double sidewall image transfer process for the 10 nanometer (nm) technology nodes and beyond.

A fin-type field effect transistor (FinFET) is a type of transistor that has a fin, containing a channel region and source and drain regions. A double-gated FinFET is a FinFET with gate conductors on both sidewall of the fin. A triple-gated FinFET is a FinFET with gate conductors on both sidewall and the top wall of the fin. The gate conductors cover the channel region of the fin, whereas the source and drain regions of the fin extend beyond the coverage of the gate conductors. FinFETs are discussed at length in U.S. Pat. No. 6,413,802 to Hu et al. (hereinafter "Hu"), which is incorporated herein by reference in its entirety. FinFETs may comprise only front and/or back gate conductors. Front gate conductors are generally isolated from any conductive material in the substrate and contacts to front gate conductors are etched from above. Back gate conductors are generally electrically connected to a conductive material in the substrate and contacts to the back conductors are etched from below. In order to improve upon current technology, manufacturers are continuously striving to increase the density of devices on integrated circuits and to simultaneously decrease the cost of producing the integrated circuits without adversely affecting performance.

To scale fin pitch to less than or equal to 40 nm, a double sidewall image transfer (SIT2). To scale fin pitch to less than or equal to 40 nm, a double sidewall image transfer (SIT2) or a self-aligned quadruple patterning (SAQP) process can be utilized. This process generates paired fins with a spacing determined by the width of the sidewall spacer that forms a second mandrel. The spacing being the two paired fins is minimized as much as possible. For some circuits, such as an SRAM bitcell, one needs to remove one of the fins in the pair, i.e., a single fin cut, as they are not intended to be part of the final FinFET devices that are formed on the substrate. The single fin to be cut is referred to as a dummy or inactive fin (i.e., FINI) and the other fin is referred to as an active fin (i.e., FINA), wherein the fin pair collectively is at minimum spacing. That minimum spacing can oftentimes be too small as a function of scaling to allow the effective removal of the FINI without damaging or removing its neighboring FINA.

SUMMARY

According to an embodiment of the present invention, a process for forming a fin structure having a fin pitch of less than 40 nanometers includes providing a multilayer structure overlaying a semiconductor substrate, wherein the multilayer structure comprises a planar cap layer, and alternating dielectric and hard mask layers stackedly arranged on the semiconductor substrate; lithographically patterning a photoresist disposed on the cap layer to form a first mandrel pattern consisting of first and second mandrel shapes; forming first sidewall spacers on the first mandrel pattern, wherein sidewall spacers between adjacent first and second mandrel shapes overlap or merge; removing the first mandrel pattern and etching the structure to form a second mandrel pattern consisting of a first mandrel shape and a second mandrel shape, wherein the second mandrel shape is at about two times a width of the first mandrel shape; forming second sidewall spacers on the second mandrel pattern; and etching the structure to form multiple fin pairs in the semiconductor substrate comprising fin pairs have a minimal spacing and fin pairs are about two times the minimal spacing.

In another embodiment, a process for forming a fin structure having a fin pitch of less than 40 nanometers includes providing a multilayer structure overlaying a semiconductor substrate, wherein the multilayer structure comprises a planar cap layer, and alternating dielectric and hard mask layers stackedly arranged on the semiconductor substrate; lithographically patterning a photoresist disposed on the cap layer to form a first mandrel pattern consisting of first and second mandrel shapes; forming first sidewall spacers on the first mandrel pattern, wherein sidewall spacers between adjacent first and second mandrel shapes define a small gap therebetween, wherein the small gap is a sub-threshold assist feature; removing the first mandrel pattern and etching the structure to form a second mandrel pattern consisting of a first mandrel shape and a second mandrel shape, wherein the second mandrel shape is at about two times a width of the first mandrel shape, and wherein the second mandrel shape is free of the sub-threshold assist feature; forming second sidewall spacers on the second mandrel pattern; and etching the structure to form multiple fin pairs in the semiconductor substrate comprising fin pairs have a minimal spacing and fin pairs are about two time the minimal spacing.

In yet another embodiment, a process for increasing active fin mask edge location tolerance associated with fabrication of an SRAM cell fin structure includes forming a fin structure comprising multiple fin pairs, wherein fins in the multiple fin pairs are either active or inactive for the SRAM cell fin structure, wherein the inactive fins are included in fin pairs that are about two times the spacing between other fin pairs, wherein the inactive fin are located between active regions of the SRAM cell fin structure; and removing at least one of the inactive fins from the fin structure.

BRIEF DESCRIPTION OF THE DRAWINGS

Referring now to the figures wherein the like elements are numbered alike.

Figures ((FIG(S).") 1A-1M schematically illustrate a process sequence for forming a FinFet structure in accordance with an embodiment.

DETAILED DESCRIPTION

The present invention is generally directed to SRAM design to facilitate single fin cut in a double sidewall image transfer process for forming fins on a substrate having a fin pitch less than 40 nm and/or having a variable pitch associated with the formation of devices such as SRAM bitcells. In the double sidewall image transfer process, a first spacer is deposited on sidewalls of a first mandrel, which are then used as a second mandrel to form a pair of fins. The spacing between two paired fins is minimized as much as possible so as to maximize fin density. In the present invention, the fin pairs are created at two different spacings without requiring the minimum space for the standard sidewall structure. An enlarged space between paired fins is created by placing two first mandrel shapes close enough so as to overlap or merge two sidewall spacer shapes defined so as to form a wider second mandrel upon further processing. The fin pair created from the wider second mandrel can be spaced to about 2 times the fin pair created from the narrower second mandrel. In some special cases, the dummy FINI can be simply be eliminated instead of being shifted away from the adjacent active FINA. As will be described in greater detail below, the resulting wider fin pair spacing allows for reduced tolerance requirements for FINI removal patterning edge placement. Alternatively, the present invention allows a second wider spacing for paired active FINAs. Advantageously, increased tolerance for the active fin mask edge location is provided.

Figure 1A:
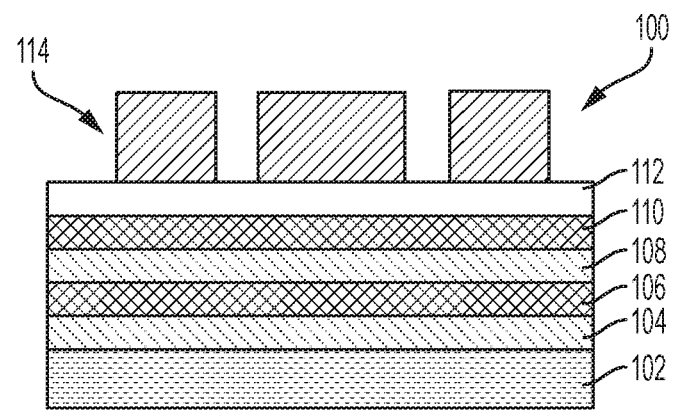
FIGS. 1N-1O schematically illustrate a process sequence for forming a FinFet structure in accordance with another embodiment.

Referring now to FIGS. 1A-1M, there is shown a process sequence for forming fins of multi-gate structures in accordance with the present invention. Referring to FIG. 1A, the process for forming a FinFET structure 100 may start with forming a stack of layers on top of a substrate 102, wherein a fin pattern of the structure is formed utilizing a double sidewall image transfer process.

It should be noted that the substrate 102 can be a bulk semiconductor substrate, a semiconductor-on-insulator substrate or the like. Further, the substrate 102 can be composed of silicon, silicon-germanium, germanium or any other suitable semiconductor materials in which fins for multi-gate devices can be formed. Furthermore, a portion of or the entire semiconductor substrate may be strained. A portion of or entire semiconductor substrate 102 may be amorphous, polycrystalline, or single-crystalline. In addition to the aforementioned types of semiconductor substrates, the semiconductor substrate 102 invention may also comprise a hybrid oriented (HOT) semiconductor substrate in which the HOT substrate has surface regions of different crystallographic orientation. The semiconductor substrate 100 may be doped, undoped or contain doped regions and undoped regions therein. The semiconductor substrate 102 may be strained, unstrained, contain regions of strain and no strain therein, or contain regions of tensile strain and compressive strain.

The stack of layers formed on substrate 102 may include, for example and starting from substrate 102, a first dielectric layer 104; a first hard mask layer 106; a second dielectric layer 108; a second hard mask layer 110; and an organic planarization layer (OPL) or anti-reflective coating (ARC) cap layer 112 (e.g., bottom anti-reflective coating), all of which may be formed on top of one another and in sequence. The dielectric layers are not intended to be limited and may be the same or different. By way of example, the dielectric layers 104, 108 may include silicon nitride, for example. Likewise, the hard mask layers 106, 110 are not intended to be limited and may be the same or different. By way of example, the hard mask layers include amorphous silicon, for example, from which the respective mandrels are formed.

Figure 1B:
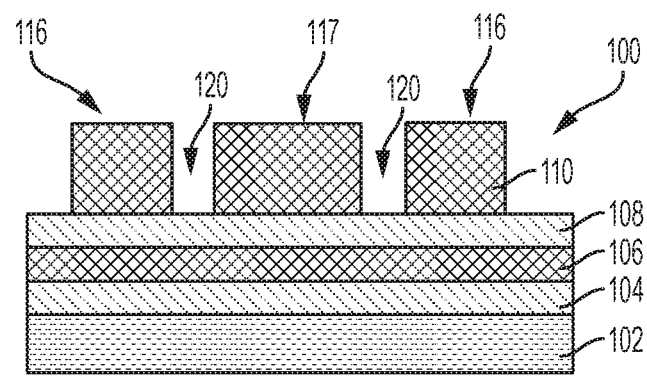

As shown in FIGS. 1A and 1B, conventional photolithography and an anisotropic etch process (e.g., reactive ion etch) is used to define a first resist pattern 114 that is etched to define first mandrel features 116 and 117 patterned according to a minimum feature size, F, that is characteristic of the lithography process used. At least one of the mandrel features 117 is in close proximity to the other mandrel feature 116 such that subsequent spacer deposition, as will be described in greater detail below, results in an overlap or merger of the sidewall therebetween.

The photolithography process may comprise, for example, introducing electromagnetic radiation such as ultraviolet light through an overlay mask to cure a photo-resist material (not shown). Depending upon whether the resist is positive or negative, uncured portions of the resist are removed to form the first resist pattern 114 including openings to expose portions of the cap layer 112 and sacrificial first mandrel layer 110.

The material defining photo-resist layer may be any appropriate type of photo-resist materials, which may partly depend upon the device patterns to be formed and the exposure method used. For example, material of photo-resist layer 114 may include a single exposure resist suitable for, for example, argon fluoride (ArF); a double exposure resist suitable for, for example, thermal cure system; and/or an extreme ultraviolet (EUV) resist suitable for, for example, an optical process. Photo-resist layer may be formed to have a thickness ranging from about 30 nm to about 150 nm in various embodiments. First resist pattern 114 may be formed by applying any appropriate photo-exposure method in consideration of the type of photo-resist material being used.

As noted above, the first resist pattern 114 is anisotropically etched to remove the first resist pattern 114, the exposed portions of the OPL/ARC layer 112 and hardmask layer 110 such as by reactive ion etching (RIE) to define the first mandrel shapes. The first resist pattern 114 is configured to provide two first mandrel shapes 116 and 117, wherein the first mandrel shapes 116 and 117 are close enough such that subsequent deposition of a spacer layer 118 (see FIG. 1C) overlaps or merges in the gap 120 therebetween, which can subsequently be used to form a wider second mandrel in the double sidewall image transfer process. In some embodiments, the overlap or merge may not be complete and a small gap may exist. In this embodiment, the size of the gap is such that it would act as a sub-threshold assist feature that would not print when forming the wider second mandrel as will be discussed below. Even if a pin hole or dent does exist on the second mandrel when formed, subsequent spacer deposition would not result in a resolvable FINI on the substrate.

The first mandrel 116 and 117 may be formed of amorphous silicon and have different widths. However, it should be noted that other materials (e.g., germanium, silicon germanium) may also be used for the mandrels so long as there is an etch selectivity with respect to subsequently formed sidewall spacers thereon. The first mandrel shapes 116a and 116b have nearly vertical etch slopes or nearly vertical contact angles. By use of the terms "nearly vertical etch slope" or "nearly vertical contact angle" is meant an angle defined by the sidewall of the opening being formed of at least 80°, preferably about 90°, with the plane of the layer 110 being etched.

The etching apparatus used in carrying out the anisotropic etch may comprise any commercially available reactive ion etching (RIE) apparatus, or magnetically enhanced reactive ion etching (MERIE) apparatus, capable of supporting a wafer of the size desired to be etched in which gases of the type used herein may be introduced at the flow rates to be discussed and a plasma maintained at the power levels required for the process. Such apparatus will be generally referred to herein as RIE apparatus, whether magnetically enhanced or not. Examples of such commercially available apparatus include the Precision 5000 magnetically enhanced reactive ion etcher available from Applied Materials, Inc.; the Rainbow reactive ion etcher by Lam; the reactive ion apparatus by Tegal Company; and the Quad reactive ion etcher by Drytek.

Figure 1C:
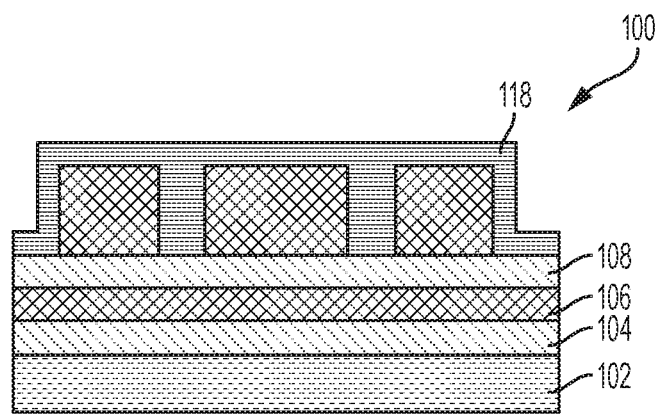

As shown in FIG. 1C, a spacer layer 118 (such as silicon dioxide or silicon nitride, $Si_3N_4$, for example) is then deposited onto the first mandrel shapes 116 and 117. In accordance with one exemplary aspect, the spacer 118 is deposited through a conformal film deposition process, such as, for example, atomic layer deposition (ALD), molecular layer deposition (MLD), or quasi-ALD or MLD processes.

Figure 1D:
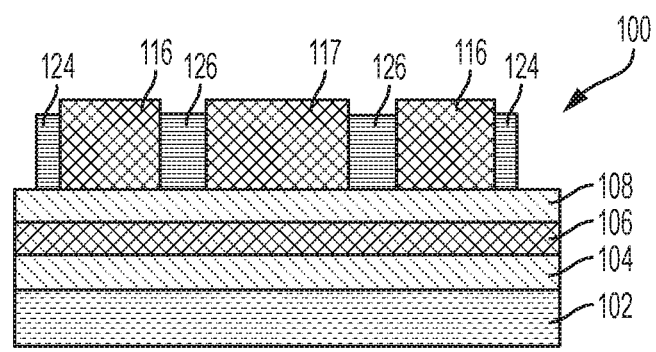

As shown in FIG. 1D, a portion of the spacer layer 118 is subsequently removed via an etch process so as to expose the top surfaces of the first mandrels 116 and 117 and form sidewall spacers 124, 126, where shown, having a thickness less than that permitted by the current ground rules. In addition, the sidewall spacers merge or overlap in the gap 120 between first mandrels 116 and 117.

Figure 1E:
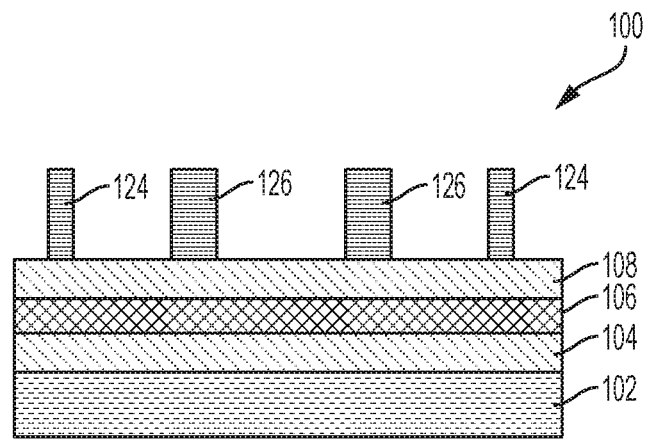

Referring now to FIG. 1E, the first mandrel structures 116 and 117 previously shown in FIG. 1D are stripped by any suitable dry and/or wet etch process, leaving the sidewall spacers 124 and 126 isolated, wherein sidewall spacer 124 has a width less than that of sidewall spacer 126. That is, the sidewall spacer 126 is equal to the width defined by gap 120 and in one aspect is about two times the width of sidewall spacer 124 as a function of the sidewall merger or overlap from the previous step.

Figure 1F:
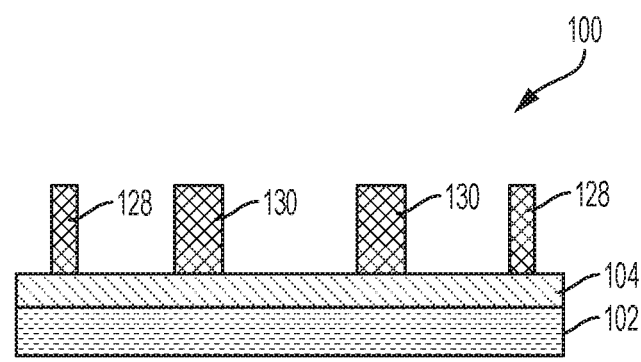

Referring now to FIG. 1F, the structure 100 is anisotropically etched to form the second mandrels 128 and 130 in layer 106. Again, the sidewall spacers 124 and 126 are utilized as a hard mask to form the second mandrels 128 and 130. The anisotropic etching process may include by reactive ion etching (RIE) to define the second mandrel shapes. The second mandrels 128 and 130 may be formed of amorphous silicon and have different widths, wherein mandrel 130 is about two times the width of mandrel 128. However, like mandrel shapes 116 and 117, it should be noted that other materials (e.g., germanium, silicon germanium) may also be used for the mandrels so long as there is an etch selectivity with respect to subsequently formed sidewall spacers thereon. The second mandrel shapes 128 and 130 have nearly vertical etch slopes or nearly vertical contact angles.

Figure 1G:
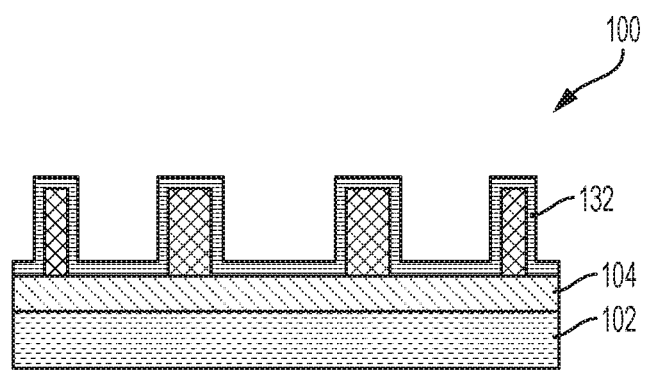

As shown in FIG. 1G, spacer layer 132 (such as silicon dioxide or silicon nitride, $Si_3N_4$, for example) is then deposited onto the second mandrel shapes 128 and 130. In accordance with one exemplary aspect, the spacer layer 132 is deposited through a conformal film deposition process, such as, for example, atomic layer deposition (ALD), molecular layer deposition (MLD), or quasi-ALD or MLD processes.

Figure 1H:
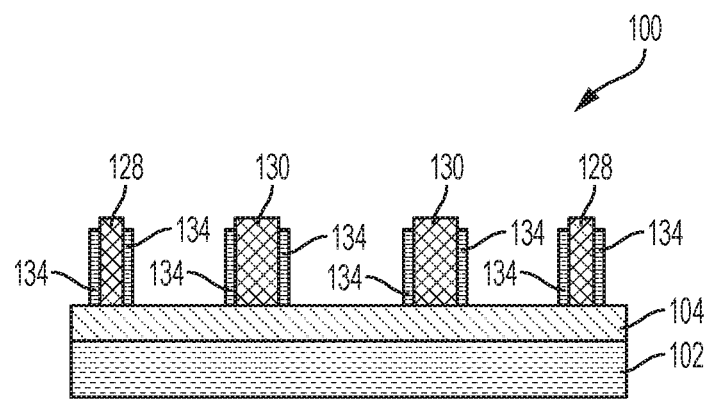

An anisotropic etch is performed to remove portions of the spacer layer 132 as so to as form the sidewall spacers 134 as shown in FIG. 1H. All of the sidewall spacers generally have the same width.

Figure 1I:
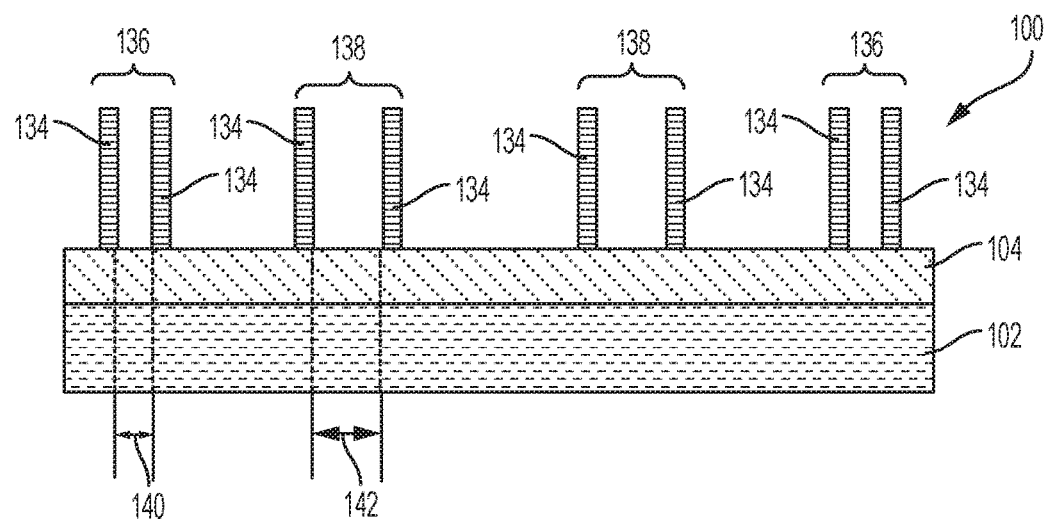

Referring now to FIG. 1I, the second mandrels 128 and 130 are removed by any suitable dry and/or wet etch process, leaving pairs 136, 138 of sidewall spacers 134. As shown, the distances between spacer pairs 136, 138 vary as a function of the prior sidewall merger or overlap in the preceding step such that distance 142 is greater than distance 140 by about two times, wherein the difference in thickness is defined by the overlap or merged sidewall spacers 124, 126 used as a hard mask to form second mandrels 128, 130. It should be apparent that the spacer width is chosen to be the same as that of the desired width of the final fin shape (with any etch film erosion factored in). Thus, spacers are formed on the vertical walls of a mandrel and these spacers determine the final pattern widths and tolerances of the components being formed in the substrate.

Figure 1J:
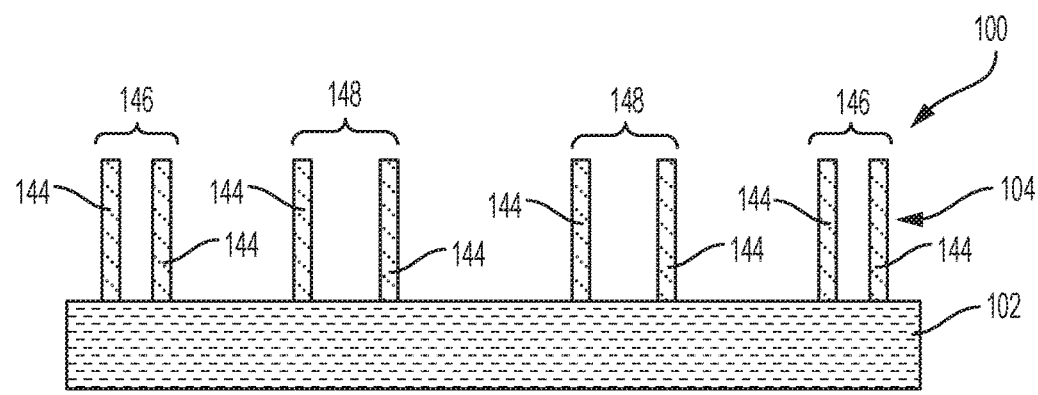

As shown in FIG. 1J, the sidewall spacers 134 are then used as a hard mask such that an anisotropic etching process transfers the pattern defined by the sidewall spacers 134 to the underlying dielectric layer 104, e.g., SiN layer. That is, pairs 146, 148 of isolated dielectric structures 144 are formed and have a width substantially the same as isolated sidewall spacers 134. Likewise, the pairs 146, 148 have spacing as previously described. Suitable anisotropic etch processes include RIE as previously discussed. When the dielectric layer 104 or 108 comprises silicon nitride, a wet etching solution with an etchant containing hydrofluoric/ethylene glycol (HF/EG) or hot phosphoric acid can be used. Alternatively, a dry etch process such as chemical downstream etch (CDE) or plasma etching can be used to etch silicon nitride. When the remaining mandrel structure comprises polysilicon, a wet etching solution with an etchant containing ammonia can be used. Alternatively, a dry etch process such as chemical downstream etch (CDE) or plasma etching can be used to etch remove polysilicon.

Figure 1K:
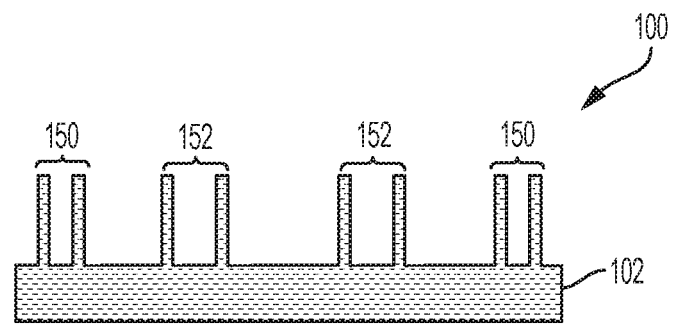

The patterned dielectric layer 104 is then transferred into the substrate 102 to form pairs of fins 150, 152 via an anisotropic etching process, e.g., a RIE process as shown in FIG. 1K. Spacing between fins in pair 152 is about 2 times that of fins in pair 150. As previously discussed, for some circuits, such as an SRAM bitcell, one needs to remove one of the fins in the pair, i.e., a single fin cut. The single fin to be cut is referred to as a dummy or inactive fin (i.e., FINI) and the other fin is referred to as an active fin (i.e., FINA).

Figure 1L:
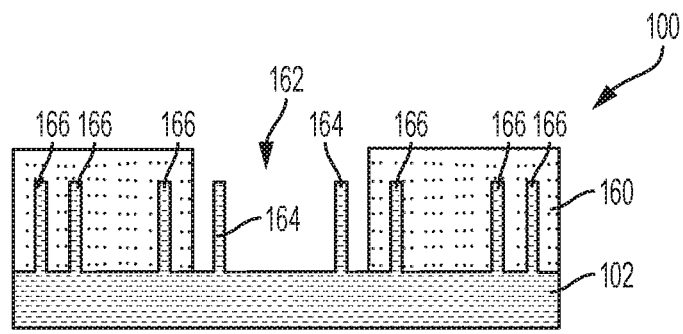
Figure 1M:
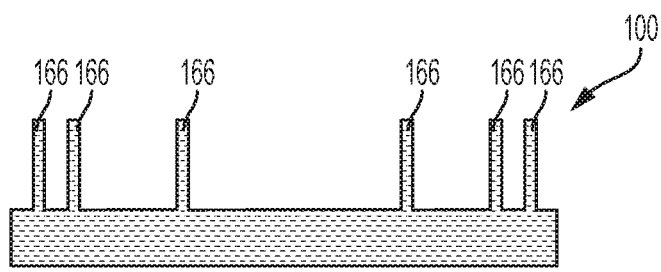

Referring now to FIG. 1L, to "cut" inactive fins, a masked silicon etching step is required. Initially, a patterned mask layer 160, e.g., a patterned photoresist mask, is formed above the substrate 102. In the depicted example, the mask layer 160 has an opening 162 that is formed so to expose illustrative dummy fins 164 for removal, while masking the active device fins 166 that will be part of the final device. The inactive fins 164 are adjacent interior fins of fin pairs 152 having the enlarged spacing relative to the other fin pair 150. In the depicted example, the two fins 164 will be removed to make room for an isolation region. However, as will be recognized by those skilled in the art, depending upon the desired final size of the isolation region, only one dummy fin 164 may be removed. Referring to FIG. 1M, the two dummy fins 164 (i.e., FINI) are shown removed by an etching process such as a timed etching process. Any etching of the substrate 102 during the dummy fin etch process is not depicted. The resist is then removed to provide the desired fin structure including the desired active device fins 166, (i.e., FINAs).

Figure 1N:
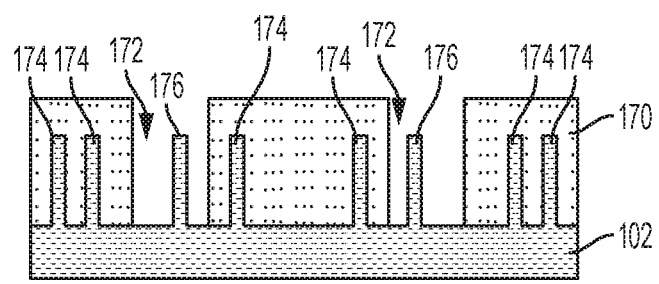
Figure 1O:
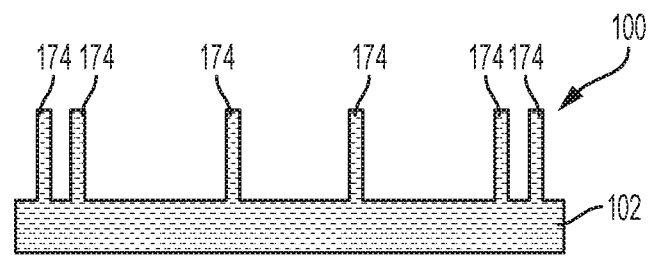

In other embodiments shown in FIGS. 1N-1O, the fin cut after the final fin reactive ionetch process are the exterior fins 176. In the depicted example, the mask layer 170 has an openings 172 that formed so to expose illustrative dummy fins 176 (FINIs) for removal, while masking the active device fins 174 (FINAs) that will be part of the final device. In the depicted example, two fins 132b will be removed to make room for two isolation regions. However, as will be recognized by those skilled in the art, depending upon the desired final size of the isolation region, only one of the fins 176 may be removed, which would require masking of the other fin assuming it will become part of the final device.

Referring to FIG. 1O, the dummy fins have been removed by an etching process such as a timed etching process, wherein fins 174 (FINAs) are part of the final device. Any residual resist is then removed to provide the desired fin structure 100 including the desired active device fins.

In some cases, with very tight fin pitches, the lithography and etching processes that are performed to remove the dummy fins can result in undesirable damage to the device fins, the fins that are intended for final use in the device 10. The present invention advantageously increases the tolerances associated with the masked silicon etching step, thereby increasing. Oftentimes, misalignment can occur for a variety of reasons, e.g., variations on photolithography tools, materials and techniques, overlay errors, etc.

Advantageously, the present invention allows the creation of FIN pairs at two spacings without requiring the minimum space for the standard sidewall structure, an enlarged space between paired FINs created by placing two mandrel (1) shapes close enough to overlap two sidewall shapes to form a wider mandrel (2). The FIN pair created from the wider mandrel (2) is spaced at about 2 times the narrow mandrel (2). The resulting wider FIN pair spacing allows reduced tolerance requirements for FINI removal patterning edge placement. Alternatively, the invention allows a second wider spacing for pair active FINAs. In one aspect, all dummy FINIs are simply eliminated and the step of FINA preserve can be skipped in the process.

Figure 2A:
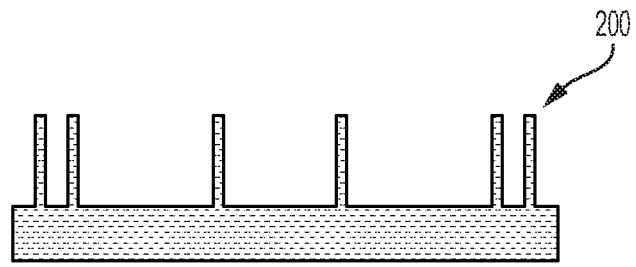
FIGS. 2A-C schematically illustrate a dummy fin cut mask tolerance for a standard double sidewall image transfer process to form a particular SRAM cell fin structure.
Figure 2B:
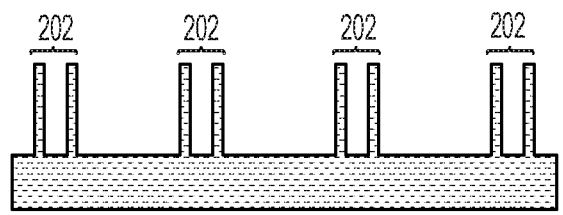
Figure 2C:
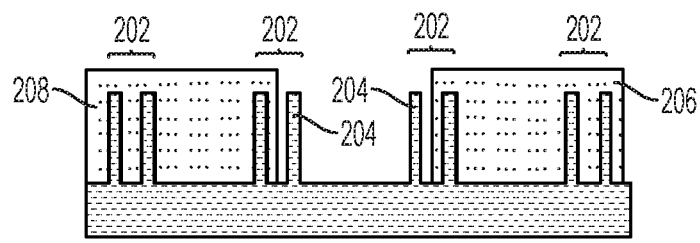
Figure 3A:
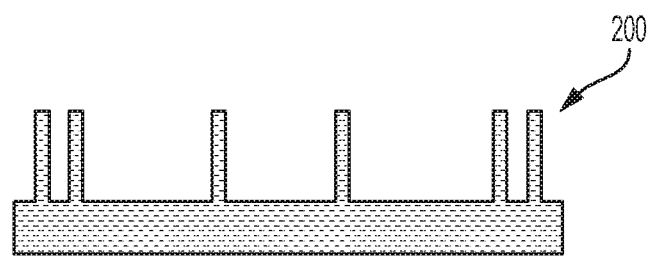
FIGS. 3A-C schematically illustrate the increased dummy fin cut mask tolerance for a double sidewall image transfer process in accordance with the present invention to form the particular SRAM cell fin structure of FIG. 2A.
Figure 3B:
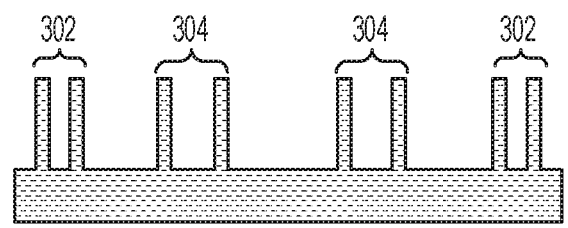
Figure 3C:
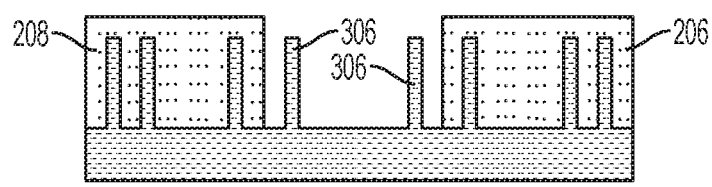

FIGS. 2A-C and 3A-C provide a comparison of the tolerances achieved using a conventional double sidewall image transfer process without sidewall overlap or merger to form the second mandrel relative to a double sidewall image transfer process with sidewall overlap or merger to form the second mandrel, respectively. As shown in FIGS. 2A and 3A, the desired FinFET structure 200 for a single SRAM 6T bitcell includes 1 fin for a pull up (PU) transistor and 2 fins for forming a pass gate (PG) transistor and a pull down (PD) transistor, which require a single fin cut from fin pairs. Using a standard double sidewall image transfer process results in multiple fin pairs 202 at a minimal space as shown in FIG. 2B, wherein the fins are generated with uniform or variable first mandrels. Because the fin pairs are at minimal space, the masked silicon etching step as is generally described above results in a tolerance of about 0.5 times the minimum fin space. As a result, the masked silicon etching step to remove inactive fins 204 in the pairs 202 corresponding to isolated regions between different active regions 206, 208 is limited. By way of example, a 27 nm fin pitch with a 6 nm fin results in a tolerance of less than about 10.5 nm; and a 24 nm fin pitch with a 6 nm fin results in a tolerance of less than about 9 nm In contrast, the masked silicon etching step tolerances to form the single SRAM 6T bitcell in accordance with the present invention is markedly increased. As shown in FIG. 3B, the sidewall overlap or merge to form the second mandrels results in fin pairs at minimal spacing (e.g., fin pair 302) and fin pairs at about two times the minimal spacing (e.g., fin pair 304). As a result, the tolerance associated with the masked silicon etching step to remove inactive fins 306 in the wider spaced fin pairs 304 corresponding to isolated regions between different active regions 206, 208 is markedly increased to form the same SRAM fin structure 200. By way of example, a 27 nm fin pitch with a 6 nm fin results in a tolerance of less than about 21 nm; and a 24 nm fin pitch with a 6 nm fin results in a tolerance of less than about 18 nm. That is, the tolerance doubled for the sidewall overlap/merge process relative to a standard double sidewall image transfer process.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A process for increasing active fin mask edge location tolerance associated with fabrication of an SRAM cell fin structure, the process comprising:

forming a fin structure comprising multiple fin pairs at a pitch of less than 40 nm, wherein individual fins in the multiple fin pairs are either active or inactive for the SRAM cell fin structure, wherein the inactive fins are included in fin pairs that are about two times the spacing between other fin pairs including active fins, wherein the inactive fins are located between active regions of the SRAM cell fin structure; and removing the inactive fins from the fin structure.

2. The process of claim 1, wherein removing the at least one inactive fin from the fin structure comprises patterning a photoresist layer to form openings exposing the at least one inactive fin within the fin pair having about two times the spacing relative to other fin pairs; and etching to remove the at least one inactive fin from the fin structure.

3. The process of claim 1, wherein etching to remove the at least one inactive fin comprises a timed etching process.

4. The process of claim 3, wherein the inactive fin in the fin pair having about two times the spacing relative to other fin pairs is proximally located to the other fin pairs with the minimal spacing.

5. The process of claim 3, wherein the inactive fin in the fin pair having about two times the spacing relative to other fin pairs is distally located to the other fin pairs with the minimal spacing.

6. The process of claim 3, wherein etching removes all of the inactive fins included in the fin pairs that are about two times the spacing between other fin pairs.

\* \* \* \* \*